United States Patent
Adam et al.

(10) Patent No.: US 11,770,914 B2
(45) Date of Patent: Sep. 26, 2023

(54) COOLING DEVICE AND METHOD OF MANUFACTURING THE SAME

(71) Applicant: Aptiv Technologies Limited, St. Michael (BB)

(72) Inventors: Frank H. Adam, Dublin (IE); Klaus Kaufmann, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 100 days.

(21) Appl. No.: 17/401,168

(22) Filed: Aug. 12, 2021

(65) Prior Publication Data

US 2022/0053663 A1    Feb. 17, 2022

(30) Foreign Application Priority Data

Aug. 13, 2020 (EP) .................................... 20190978

(51) Int. Cl.
*H05K 7/20* (2006.01)

(52) U.S. Cl.
CPC ....... *H05K 7/2039* (2013.01); *H05K 7/20872* (2013.01)

(58) Field of Classification Search
CPC .......................... H01L 23/473; H05K 7/2039; H05K 7/20872; H05K 7/20509; H05K 7/20272; H05K 7/20254; H05K 7/20927
See application file for complete search history.

(56) References Cited

U.S. PATENT DOCUMENTS

| | | | |
|---|---|---|---|
| 6,111,749 A | 8/2000 | Lamb et al. | |
| 6,364,009 B1 | 4/2002 | MacManus et al. | |
| 8,432,691 B2 | 4/2013 | Toftloekke et al. | |
| 9,036,353 B2 | 5/2015 | Buckman et al. | |
| 9,694,451 B1 | 7/2017 | Ross | |
| 9,907,216 B2 | 2/2018 | Park | |
| 10,542,640 B1* | 1/2020 | Leigh | H05K 7/20772 |
| 10,631,438 B2 | 4/2020 | Coteus et al. | |
| 2005/0128705 A1 | 6/2005 | Chu et al. | |
| 2006/0227504 A1 | 10/2006 | Chen et al. | |

(Continued)

FOREIGN PATENT DOCUMENTS

| | | |
|---|---|---|
| DE | 2614917 | 10/1976 |
| EP | 1020910 | 7/2000 |

(Continued)

OTHER PUBLICATIONS

"Extended European Search Report", EP Application No. 21150125.9, dated May 31, 2021, 16 pages.

(Continued)

*Primary Examiner* — Adam B Dravininkas
(74) *Attorney, Agent, or Firm* — Sawtooth Patent Group PLLC

(57) ABSTRACT

A cooling device for cooling electronic components mounted on a circuit board. The device comprises a hollow body defining a coolant transport circuit for circulating coolant fluid there thorough. The hollow body comprises a plurality of flattened regions linked by duct regions, wherein the flattened regions and duct regions are formed as continuous regions of the body. When the body is secured to the circuit board, each flattened region is configured to align with one or more electronic components for transferring heat away.

20 Claims, 2 Drawing Sheets

(56) References Cited

U.S. PATENT DOCUMENTS

| | | | |
|---|---|---|---|
| 2007/0089858 A1* | 4/2007 | Andberg | G01R 31/2891 |
| | | | 165/80.4 |
| 2007/0177356 A1 | 8/2007 | Panek | |
| 2008/0259566 A1* | 10/2008 | Fried | H05K 7/20809 |
| | | | 165/80.4 |
| 2008/0296256 A1 | 12/2008 | Panek | |
| 2009/0213541 A1 | 8/2009 | Butterbaugh et al. | |
| 2012/0063098 A1 | 3/2012 | Paquette et al. | |
| 2012/0103576 A1 | 5/2012 | Toftloekke et al. | |
| 2013/0343005 A1 | 12/2013 | David et al. | |
| 2014/0146475 A1 | 5/2014 | Buckman et al. | |
| 2014/0233175 A1 | 8/2014 | Demange et al. | |
| 2016/0291652 A1 | 10/2016 | Rossi et al. | |
| 2017/0082222 A1 | 3/2017 | Buvid et al. | |
| 2017/0347486 A1* | 11/2017 | Schaltz | G06F 1/20 |
| 2018/0058777 A1* | 3/2018 | Anderson | F28D 15/00 |
| 2019/0056179 A1* | 2/2019 | Chialastri | H05K 7/20254 |
| 2019/0131204 A1* | 5/2019 | Gaskill | G06F 1/203 |
| 2019/0204023 A1* | 7/2019 | Takken | F28F 3/04 |
| 2019/0259632 A1* | 8/2019 | Isaacs | H01L 23/3677 |
| 2020/0024763 A1 | 1/2020 | Dan et al. | |
| 2020/0337181 A1 | 10/2020 | Tian et al. | |

FOREIGN PATENT DOCUMENTS

| | | |
|---|---|---|
| EP | 3037771 | 6/2016 |
| GB | 2310321 | 8/1997 |
| GB | 2584991 | 12/2020 |
| WO | 2010077237 | 7/2010 |
| WO | 2020035172 | 2/2020 |
| WO | 2020234600 | 11/2020 |

OTHER PUBLICATIONS

"Extended European Search Report", EP Application No. 20179751.1, dated Nov. 18, 2020, 12 pages.

"Extended European Search Report", EP Application No. 20190978.5, dated Jan. 20, 2021, 8 pages.

* cited by examiner

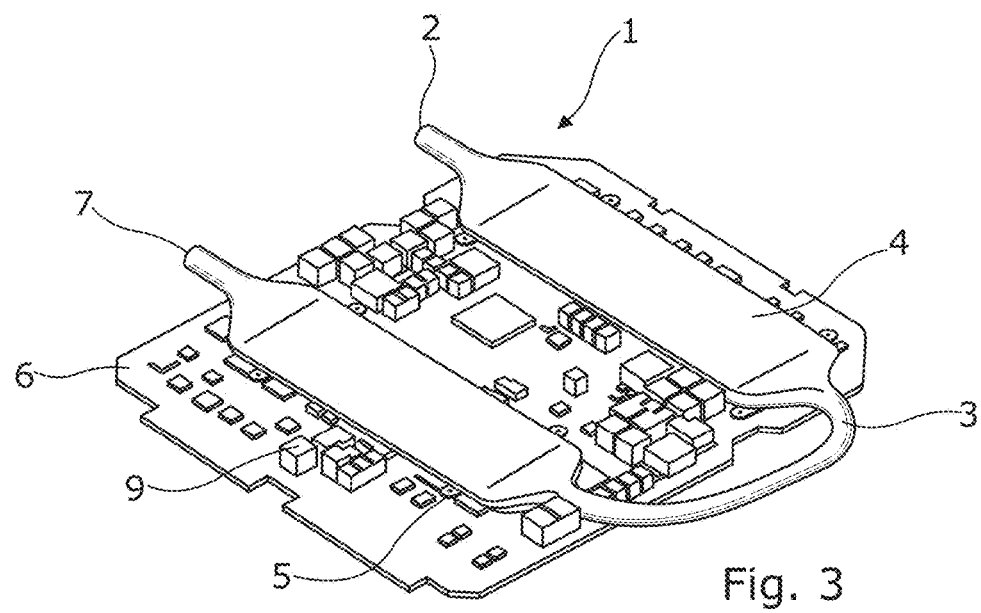
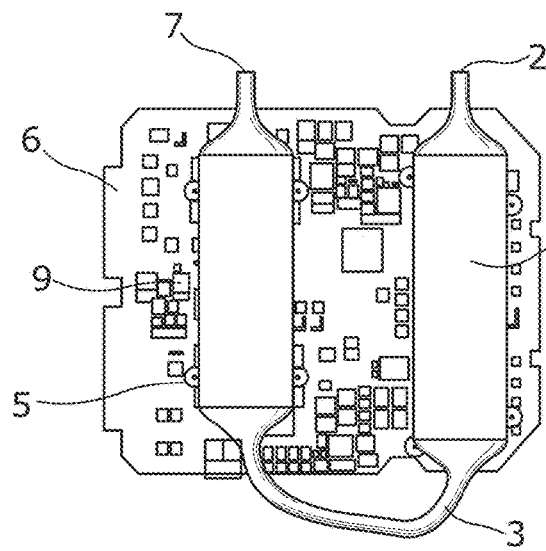 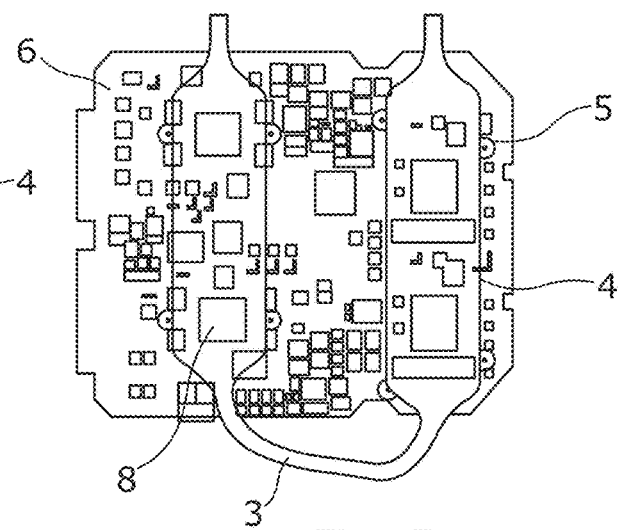
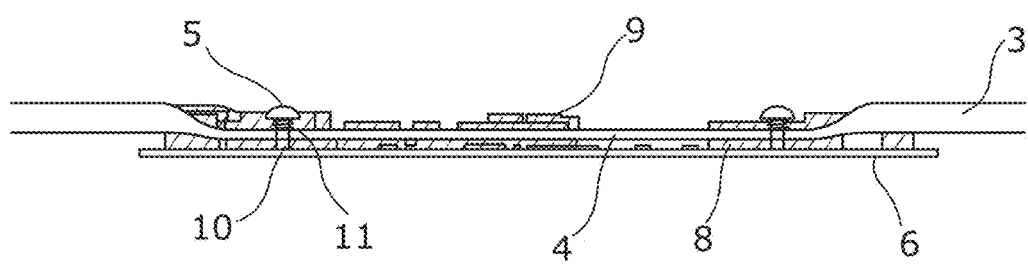

COOLING DEVICE AND METHOD OF MANUFACTURING THE SAME

CROSS-REFERENCE TO RELATED APPLICATION

This application claims priority to European Patent Application Number 20190978.5, filed Aug. 13, 2020, the disclosure of which is hereby incorporated by reference in its entirety herein.

BACKGROUND

Some electronics components get hot during use, which can subsequently compromise their function or lead to component damage. As such, it is common to fit cooling devices to electronic circuitry to maintain their operating temperature within an acceptable tolerance. Existing cooling device technology can be deficient in cooling components mounted to a circuit board.

The present disclosure relates to a cooling device for cooling a plurality of electronic components mounted on a circuit board, and a method of manufacturing the same. The present disclosure is particularly relevant to cold plates for cooling electronic control units for automotive applications and most particularly to multi domain controllers (MDCs).

SUMMARY

The present disclosure concerns a cooling device and method for manufacturing a cooling device for cooling a plurality of electronic components mounted on a circuit board. The cooling device may for use with electronic control unit or multi domain controller mounted to a printed circuit board.

According to a first aspect, there is provided a cooling device for cooling electronic components mounted on a circuit board, the device including: a hollow body defining a coolant transport circuit for circulating coolant fluid there thorough, the hollow body including a plurality of flattened regions linked by duct regions, wherein the flattened regions and duct regions are formed as continuous regions of the body, and wherein each flattened region is configured to align with one or more electronic components when the body is secured adjacent to the circuit board for transferring heat away from the respective one or more electronic components.

In this way, the flattened regions of the body provide a large heat absorption surface which can be located directly adjacent to heat dissipating, active electronic components. This brings the coolant into much closer proximity with those electronic components which get hot during operation, thereby providing an increased heat flux into the coolant, and consequently improved cooling performance. At the same time, as both the flattened regions and the duct regions of the body are formed continuously with one another, unlike modular arrangements, there are no joints or seals between sections. This not only avoids the associated production and assembly costs of having separate parts, but the provision of the hollow body as a single cooling tube avoids the risk of leaky connections between different functional parts.

In embodiments, the cooling device further includes one or more couplings for securing the body to the circuit board. In this way, the cooling device may be secured directly to the circuit board to provide a compact assembly. In embodiments, the couplings comprise a fixture aperture for receiving a fixture for attaching the flattened regions to the circuit board.

In embodiments, the couplings include a biasing element for biasing the flattened regions toward the electronic components. In this way, the volume of thermal interface material required to maintain an effective thermal contact is minimised. Furthermore, the mating between the flattened regions and the active components may be maintained throughout different operating conditions, thereby providing improved cooling consistency.

In embodiments, the couplings include a fixture and the biasing element is a spring coupled to the fixture for applying a biasing force to the flattened region for biasing it toward the respective one or more electronic components to be cooled. In this way, the spring allows a consistent compressive pressure to be applied and maintained at the plurality of couplings.

In embodiments, at least one coupling is associated with each flattened region for securing it to the respective one or more electronic components to be cooled. In this way, the couplings may provide a localised securing force to retain the flattened regions against their respective electronic components. For example, localised compressive pressure may be clustered around specific components in order to ensure mating contact by the flattened regions is maintained.

In embodiments, each coupling includes an aperture for receiving a fixture. In this way, fixtures may be accommodated through holes that can be simply machined into lugs provided on the exterior of the body.

In embodiments, one or more of the flattened regions has substantially the same cross-sectional area as one or more of the duct regions. In this way, a consistent fluid flow speed may be maintained, thereby mitigating the risk of still zones of coolant forming which may otherwise reduce heat transfer efficiency.

In embodiments, one or more of the flattened regions has a smaller cross-sectional area than one or more of the duct regions. In this way, zones of localised higher flow rates or turbulence may be created within the hollow body for increasing heat exchange in these regions.

In embodiments, the body is formed by hydroforming. Preferably, the body is formed by tube hydroforming. In this way, the body may be formed as a thin walled hollow structure, which not only reduces weight and material costs, but also allows for enhanced cooling efficiency by reducing the distance of the thermal path between the active components and the coolant. In alternative embodiments, the body may be formed by 3D printing.

In embodiments, the body is formed of metal. This provides a highly thermally conductive material for enhanced cooling efficiency, as well as sufficient rigidity to allow for easy connection to the circuit board.

In embodiments, the flattened regions and duct regions are formed integrally.

In embodiments, the flattened regions comprise a flattened cooling face for mating against the respective one or more electronic components to be cooled.

In embodiments, the body comprises internal formations for disrupting coolant fluid circulating through the coolant transport circuit. In this way, heat exchanging formations may be provided within the coolant transport circuit for enhancing heat transfer.

In embodiments, the circuit board further comprises passive components and the body is configured to leave the passive components exposed when secured adjacent to the circuit board. In this way, the flattened regions of the cooling device may be seated below the height of the passive components, thereby allowing their cooling surfaces to be located closer to the hotter active components. Furthermore, the cooling effect can also thereby be focused on the active components According to a second aspect, there is provided a method of forming a cooling device for cooling electronic components mounted on a circuit board, the method including: providing a blank; pressing the blank in a die to form a hollow body having a plurality of flattened regions linked by duct regions, wherein the flattened regions and duct regions are formed as continuous regions of the body, and wherein the hollow body defines a coolant transport circuit for circulating coolant fluid there thorough and each flattened region is configured to align with one or more electronic components when the body is secured adjacent to the circuit board for transferring heat away from the respective one or more electronic components.

In this way, a simple manufacturing method is provided for forming a highly efficient and lightweight cooling device.

In embodiments, the blank is a tube having a wall defining an internal bore, and the step of pressing the blank comprises securing the tube within the die and applying a pressurised liquid to the internal bore for conforming the wall to the shape of the die. In this way, hydroforming may be used to form the body as a thin walled, hollow structure. This may thereby provide a cooling device with reduced weight and material costs, as well as providing enhanced cooling efficiency.

BRIEF DESCRIPTION OF THE DRAWINGS

Illustrative embodiments will now be described with reference to the accompanying drawings in which:

FIG. 3 shows an isometric view of a cooling device according to a second embodiment;

FIG. 4 shows a top view of the cooling device shown in FIG. 3;

FIG. 5 shows an alternative top view of the cooling device shown in FIG. 3 with the flattened regions transparent; and FIG. 6 shows a cross sectional view along the coolant pathway and through a flattened region of the cooling device shown in FIG. 3.

DETAILED DESCRIPTION

Figure 1:
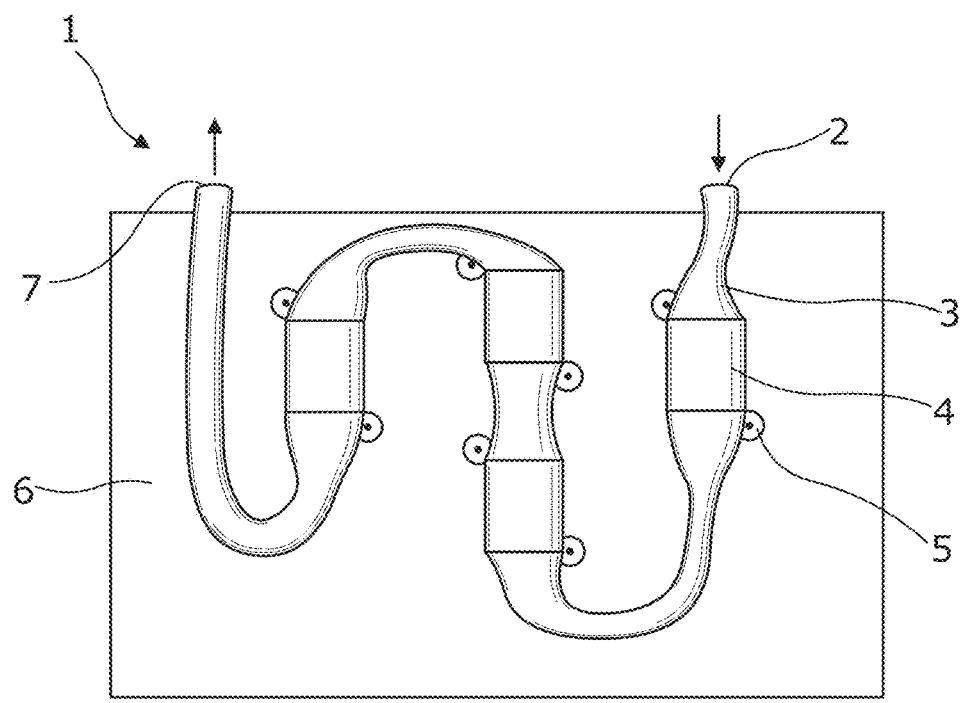
FIG. 1 shows a top view of a cooling device according to a first embodiment.

Some electronics components get hot during use, which can subsequently compromise their function or lead to component damage. As such, it is common to fit cooling devices to electronic circuitry to maintain their operating temperature within an acceptable tolerance. For particularly high demand applications, liquid cooling systems are often used due to their high cooling efficiency. Conventional liquid cooling systems often have a cold plate, which is a device typically having a flat metal body with an internal circuit of cooling channels or tubes through which coolant fluid may be circulated. In use, the cold plate is fitted against the electronic components and, as components get hot, heat is transferred through the body and cooling tubes into the coolant, from where it is transported away from the circuit.

Although some electronic components on a printed circuit board (PCB) can become very hot in use, other components do not. For example, a Systems-on-a-Chip (SoC) may be thought of as an active component because it typically generates large amounts of waste heat when operating and requires active cooling. Conversely, components such as diodes or capacitors may be thought of as passive components because they will generally remain relatively cool. At the same time, active components are often geometrically lower (i.e. flatter) than surrounding cooler, passive components. Therefore, when a flat cold plate is fitted over a PCB, it is common for the plate to abut the tops of the taller, passive components, but leave a gap between the plate and the tops of the lower, active components. As these air gaps would otherwise provide a barrier to heat transfer from the very components the cold plate is intended to cool, it is therefore necessary to fit so-called "pedestals" in these gaps. These pedestals are typically formed of the same metal as the body of the cold plate and provide a column of thermally conductive material for establishing a thermal path from the active component through to the cold plate.

An issue with the above conventional arrangements is that, despite the thermal conductivity of the pedestal-material, the length of the thermal path means that pedestals nevertheless present a significant thermal resistance. Pedestals thereby provide a sub-optimal thermal connection between the active components and the coolant.

The above issue is further exacerbated by the challenge of ensuring good thermal contact between the pedestal and the active component. In particular, air gaps between the opposing faces of the component and the pedestal could significantly reduce thermal conduction. These gaps may be anything from very tiny holes due to surface roughness, up to larger gaps caused by production variations compromising the dimensional stability of the assembly. For example, the PCB may not be perfectly flat, leading to some components being mounted further from the cold plate than others. To mitigate this, it is common to apply a layer of Thermal Interface Material (TIM) to fill these gaps and thereby improve the mating at the junction between the parts. However, as larger gaps can occur, it is typical to apply a relatively thick layer of TIM to ensure there is sufficient material to fill the gaps in their entirety. This unfortunately compromises the overall thermal conductivity because, although TIM is a better thermal conductor than air, it is not as effective as providing a very close connection between the hot, active component and the cooling structures.

US 20050128705 discloses a cooling assembly which attempts to address some of the above issues. In particular, US 20050128705 teaches a modular arrangement in which, rather than provide a cold plate as a single body, a plurality of smaller cold plate units are provided, each independently attachable to an individual electronic module. The cold plate units are then connected to each other by flexible tubes to establish the cooling fluid circuit. Although this arrangement allows closer mating between each electronic module and its respective cold plate unit, it raises new issues. For example, the manufacturing and assembly costs are greatly increased because each cold plate unit must be individually fabricated and secured to its respective electronic module. Furthermore, the large number of fluid connections between the cold plate units and the tubing also raises leakage risks. This makes such an arrangement particularly unsuitable for automotive applications where the harsh vibrational conditions necessitate very high leak resistance.

There therefore remains a need for an improved cooling device for cooling components mounted to a circuit board.

Figure 2:
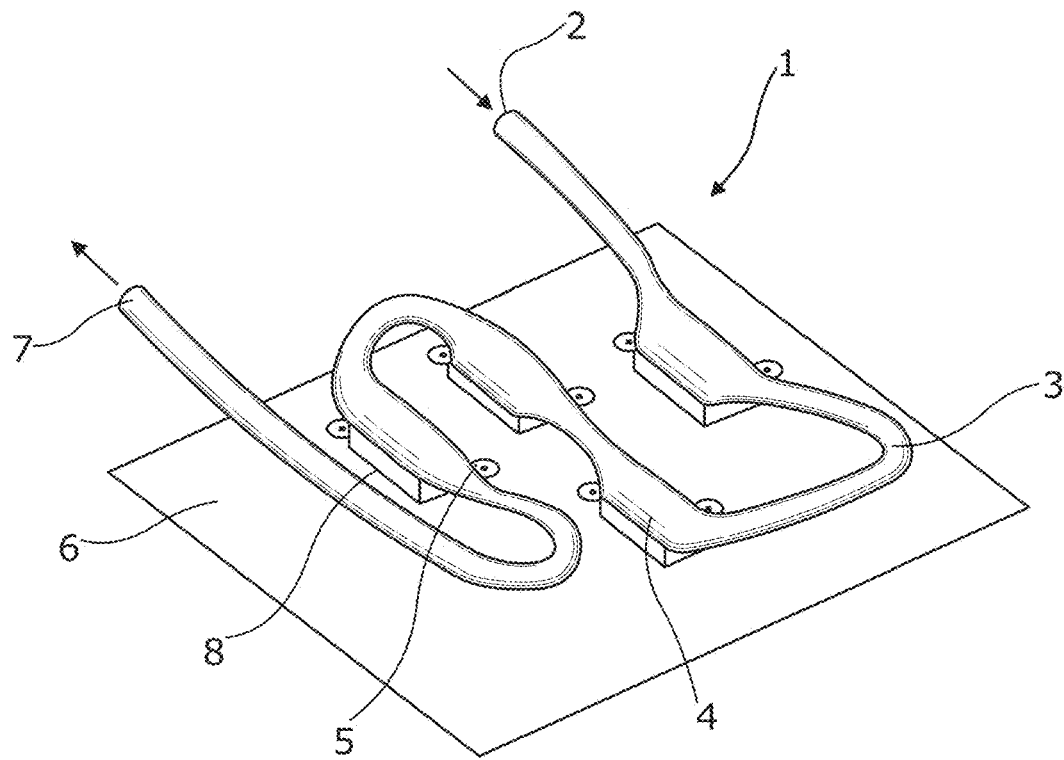
FIG. 2 shows an isometric view of the cooling device shown in FIG. 1.

FIGS. 1 and 2 show a first embodiment of a cooling device 1 provided as a continuous tubular body 3,4 having a plurality of flattened regions 4, linked by duct regions 3. The hollow interior bore of the body 3,4 forms a fluid circuit between the inlet 2 to the outlet 7. In use, coolant fluid is pumped through the fluid circuit to transfer heat away from adjacent electronic components.

The duct regions 3 have a substantially circular cross section and are configured to weave over the circuit board 6, avoiding taller passive components (not shown) which project from its surface.

At the junctions between the duct 3 and flattened regions 4, the circular cross section transitions into a wider flattened section having a substantially flat bottom face. The flattened bottom face of each flattened region 4 provides a mating surface for mating with the top faces of the active components 8 which generate heat during their operation. At the same time, as shown in FIG. 2, the flattened regions 4 within the body 3,4 are positioned such that they overlay the active electronic components 8 on the circuit board 6 when the cooling device is fitted thereto.

The cooling device 1 further includes a plurality of couplings 5 for securing the device 1 to the circuit board 6. The couplings 5 comprise fixture lugs which extend from the exterior of the body 3,4 and comprise apertures for receiving biasing fixtures, which are used to connect the body 3,4 to the circuit board 6.

In this embodiment, the body 3,4 is formed as a single piece using tube hydroforming. A pre-cursor tube is bent into an approximated shape and pressed within a die. High pressure liquid, such as water, is then applied through the bore of the tube to force the walls to conform with the die. This provides a single unitary component, which mitigates the risk of coolant leaks and simplifies connection of the device 1 to the circuit board 6. At the same time, a robust, thin walled structure is provided which is not only resilient to operating conditions, but also allows provides efficient heat transfer from the active components 8 to coolant circulating through the body 3,4.

FIGS. 3 to 6 show a cooling device according to a second embodiment. Although these figures provide a more detailed illustration of the device 1 and the circuit board 6, the device 1 functions in substantially the same way as the first embodiment, and therefore the description of common parts is omitted.

As shown, the device 1 has been fitted to a circuit board 6 for cooling electronic components during their operation. The circuit board 6 is a printed circuit board including a plurality of components, some of which may be classed as active components 8 in that they generate heat during operation and require cooling, and some of which may be classed as passive components 9 in that they do not require cooling, or only require passive cooling, during operation.

The device's body 3,4 comprises two flattened regions 4, with duct regions 3 connecting between the two flattened regions 3 and forming the inlet 2 and outlet 7. The flattened regions 4 have a very thin flat configuration with a wide, rectangular cross section. The cross-sectional area of each flattened section is substantially the same as the bore area of the circular duct regions 3. As such, the flow rate of coolant throughout the cooling device is substantially constant. This may thereby mitigate the risk of dead zones of coolant, where low flow rates could reduce cooling efficiency.

FIG. 5 illustrates the assembly with the flattened regions 4 transparent to show the active components 8 being overlaid. This leaves the passive components 9 exposed. As such, the cooling effect is focused on the components which get hot during operation of the circuit.

FIG. 6 shows a cross sectional view through one of the flattened regions 4, with the section taken in line with the coolant pathway. As shown, the duct regions 3 taper downwardly into the thin, flattened region 4, and the bottom external surface mates with the top surfaces of the underlying active components 8. The flattened region 4 is also seated lower than the height of the passive components 9, thereby bringing the coolant into closer proximity to the heat dissipated by the active components 8.

FIG. 6 also shows the fixtures of the couplings 5 in further detail. In this embodiment, the fixtures are provided as screws 10 which extend through lugs provided on the body 3,4 and are received into threaded apertures provided on the circuit board 6. Each fixture has a biasing element in the form of compression spring 11 arranged coaxially with the screw 10. The springs 10 are braced between the screw's head at the top and the lugs extending from the body 3,4 to thereby apply a compressive force for biasing the body 3,4 into contact with the active components 8 it overlays. At the same time, the couplings 5 are clustered around the active components 8. As such, a consistent compressive force may be applied to maintain good thermal contact between the mating face of the flattened regions 4 and the underlying active components 8 throughout different operating conditions. As such, variations in operating loads and the thermal expansion coefficients of different components can be accommodated. Furthermore, in automotive applications, contact can be maintained even when vibrations arise during driving. This may thereby compensate for any dimensional variations in the assembly which could otherwise result in larger air gaps between the contacting surfaces. As a result, the need for Thermal Interface Material (TIM) is limited to compensating for any residual gaps that could arise due to the surface roughness of the active components 8 and the flattened regions 4. Therefore, only a very thin layer of TIM is required.

In use, coolant, for example a water/glycol mixture, is pumped through inlet 2, enters and fills the first flattened section 4, flows through the duct section 3 and fills the second flattened section 4, before exiting through outlet pipe 7. As such, coolant is flooded over the interior of the flattened regions 4, drawing heat from the top surface of the active components 8. In automotive applications, the inlet 2 and outlet pipes 7 may be fed by the vehicle's cooling system.

With the above arrangement, the flattened regions 4 may provide a good thermal contact with the active components 8, whilst allowing the coolant to be located much closer to those active components 8 than they would in a conventional cold plate system. At the same time, the device requires less material compared to conventional cold plate systems, thereby saving weight and costs, as well as providing a very high cooling efficiency.

It will be understood that the embodiments illustrated above shows an application only for the purposes of illustration. In practice, embodiments may be applied to many different configurations, the detailed embodiments being straightforward for those skilled in the art to implement.

For example, although the flattened regions 4 have been illustrated as having a flat bottom surface for mating to the active components, it will be understood that component formations may also be provided on this surface. That is projections and/or depressions corresponding to the tops of the associated active components may be formed to thereby improve the mating of the cooling surface with the components.

In addition, although the body 3,4 has been described as having a hollow tubular construction, albeit with flattened regions, formations may be provided to control flow rates and turbulence within the coolant transport circuit. For example, to enhance heat exchange, one or more of the flattened regions may have a reduced cross-sectional area to increase fluid flow through this region. Furthermore, internal formations may be provided to generate localised turbulence in the coolant flow for enhancing cooling efficiency.

Finally, although the above examples describe the formation of the body as a single unitary piece, it will be understood that the body may be formed of parts, which are assembled together during manufacture to form a single unit. For example, the body may be cast as upper and lower sections which are then welded together. Nevertheless, the flattened and duct regions of the body are formed continuously with one another. That is, even where the body may be formed from constituent parts, those constituent parts will comprise both flattened and duct regions. As such, the risk of leaks developing between different functional parts of the body is mitigated.

What is claimed is:

1. A cooling device for cooling electronic components mounted on a circuit board, the circuit board also comprising passive components, the device comprising:
   a hollow body defining a coolant transport circuit for circulating coolant fluid therethrough,
   the hollow body comprising a plurality of flattened regions linked by duct regions,
   the flattened regions and duct regions forming continuous regions of the hollow body, one or more flattened regions of the flattened regions having substantially the same cross-sectional area as one or more duct regions of the duct regions, and
   each flattened region being configured to align with one or more electronic components on the circuit board for transferring heat away from the one or more electronic components when the hollow body is secured adjacent to the circuit board while leaving the passive components exposed when the hollow body is secured adjacent to the circuit board.

2. The cooling device according to claim 1, further comprising one or more couplings for securing the hollow body to the circuit board.

3. The cooling device according to claim 2, wherein the couplings comprise a biasing element for biasing the flattened regions toward the electronic components.

4. The cooling device according to claim 3, wherein the couplings comprise a fixture and the biasing element is a spring coupled to the fixture for applying a biasing force to the flattened region for biasing toward the respective one or more electronic components to be cooled.

5. The cooling device according to claim 2, wherein at least one coupling is associated with each flattened region for securing it to the respective one or more electronic components to be cooled.

6. The cooling device according to claim 1, wherein one or more other flattened regions of the flattened regions has a smaller cross-sectional area than one or more other duct regions of the duct regions.

7. The cooling device according to claim 1, wherein the body is formed by hydroforming.

8. The cooling device according to claim 1, wherein the body is formed of metal.

9. The cooling device according to claim 1, wherein the flattened regions and duct regions are formed integrally.

10. The cooling device according to claim 1, wherein the flattened regions comprise a flattened cooling face for mating against the respective one or more electronic components to be cooled.

11. A method of forming a cooling device for cooling electronic components mounted on a circuit board, the circuit board also comprising passive components, the method comprising:
    providing a blank; and
    pressing the blank in a die to form a hollow body having a plurality of flattened regions linked by duct regions, wherein
       the flattened regions and duct regions are formed as continuous regions of the hollow body, one or more flattened regions of the flattened regions having substantially the same cross-sectional area as one or more duct regions of the duct regions,
       the hollow body defines a coolant transport circuit for circulating coolant fluid therethrough, and
       each flattened region is configured to align with one or more electronic components on the circuit board when the hollow body is secured adjacent to the circuit board for transferring heat away from the one or more electronic components while leaving the passive components exposed when the hollow body is secured adjacent to the circuit board.

12. The method of claim 11, wherein the blank is a tube having a wall defining an internal bore, and pressing the blank comprises securing the tube within the die and applying a pressurised liquid to the internal bore for conforming the wall to the shape of the die.

13. The method of claim 11, further comprising:
    forming one or more other flattened regions of the flattened regions to have a smaller cross-sectional area than one or more other duct regions of the duct regions.

14. The method of claim 11, further comprising forming the body by hydroforming.

15. The method of claim 11, further comprising forming the body from metal.

16. A system comprising:
    a circuit board;
    one or more electronic components mounted to the circuit board;
    one or more passive components mounted to the circuit board; and
    a cooling device configured to cool the one or more electronic components, the cooling device comprising:
       a hollow body defining a coolant transport circuit for circulating coolant fluid through the coolant transport circuit,
       a plurality of flattened regions of the hollow body that are linked by duct regions of the hollow body to form continuous regions of the hollow body, one or more flattened regions of the flattened regions having substantially the same cross-sectional area as one or more duct regions of the duct regions, each flattened region being configured to align with the one or more electronic components on the circuit board for transferring heat away from the one or more electronic components when the hollow body is secured adjacent to the circuit board while leaving the passive components exposed when the hollow body is secured adjacent to the circuit board.

17. The system of claim 16, wherein one or more other flattened regions of the flattened regions has a smaller cross-sectional area than one or more other duct regions of the duct regions.

18. The system of claim 16, wherein the flattened regions comprise a flattened cooling face for mating against the respective one or more electronic components to be cooled.

19. The system of claim 16, wherein the cooling device further comprises one or more couplings for securing the hollow body to the circuit board.

20. The system of claim 19, wherein the couplings comprise a biasing element for biasing the flattened regions toward the one or more electronic components.

* * * * *